US012593416B2

(12) United States Patent
Liu et al.

(10) Patent No.: US 12,593,416 B2
(45) Date of Patent: Mar. 31, 2026

(54) ELECTRONIC DEVICE

(71) Applicant: VIVO MOBILE COMMUNICATION CO., LTD., Dongguan (CN)

(72) Inventors: Ninglin Liu, Dongguan (CN); Dingjian Yang, Dongguan (CN)

(73) Assignee: VIVO MOBILE COMMUNICATION CO., LTD., Dongguan (CN)

( * ) Notice: Subject to any disclaimer, the term of this patent is extended or adjusted under 35 U.S.C. 154(b) by 161 days.

(21) Appl. No.: 18/758,366

(22) Filed: Jun. 28, 2024

(65) Prior Publication Data

US 2024/0357757 A1 Oct. 24, 2024

Related U.S. Application Data

(63) Continuation of application No. PCT/CN2022/142588, filed on Dec. 28, 2022.

(30) Foreign Application Priority Data

Dec. 29, 2021 (CN) .......................... 202111643463.6

(51) Int. Cl.
  H05K 5/02 (2006.01)
  F16C 11/04 (2006.01)
(52) U.S. Cl.
  CPC ............ H05K 5/0226 (2013.01); F16C 11/04 (2013.01)
(58) Field of Classification Search
  CPC ................................................. H05K 5/0226
  See application file for complete search history.

(56) References Cited

U.S. PATENT DOCUMENTS

| | | | | |
|---|---|---|---|---|
| 10,641,318 B2 * | 5/2020 | Siddiqui | ............... | G06F 1/1616 |
| 11,834,880 B2 * | 12/2023 | Peng | ..................... | E05D 11/082 |
| 2020/0001684 A1 | 1/2020 | Akiyama | | |
| 2022/0248548 A1 | 8/2022 | Zhong et al. | | |

(Continued)

FOREIGN PATENT DOCUMENTS

| | | |
|---|---|---|
| CN | 110266836 A | 9/2019 |
| CN | 110572496 A | 12/2019 |

(Continued)

OTHER PUBLICATIONS

He, Liuyu et al., "The Synchronous Unfolding and Folding Control Technology Based on the Multiple Electric Cylinders for Large Scale Folding Split Screen", Machine Tool & Hydraulics, Jan. 2018, vol. 46, No. 2.

*Primary Examiner* — Jerry Wu
(74) *Attorney, Agent, or Firm* — The Webb Law Firm

(57) ABSTRACT

An electronic device including a first device body, a second device body, a rotating mechanism, and a flexible display screen. The flexible display screen includes a first display screen, a second display screen, and a third display screen. The first device body is rotatably connected to the second device body via the rotating mechanism; the first display screen is connected to the second display screen via the third display screen; the first device body is connected to the first display screen, and the second device body is connected to the second display screen. The rotating mechanism includes a shaft, a transmission apparatus, and a top rod. The shaft is connected to the top rod via the transmission apparatus, and at least one of the first device body or the second device body is connected to the top rod.

12 Claims, 11 Drawing Sheets

(56)             References Cited

U.S. PATENT DOCUMENTS

| | | |
|---|---|---|
| 2022/0390986 A1 | 12/2022 | Pan et al. |
| 2022/0413555 A1 | 12/2022 | Ma |

FOREIGN PATENT DOCUMENTS

| | | |
|---|---|---|
| CN | 110784567 A | 2/2020 |
| CN | 112901645 A | 6/2021 |
| CN | 113012569 A | 6/2021 |
| CN | 113383380 A | 9/2021 |
| CN | 113643612 A | 11/2021 |
| CN | 113794792 A | 12/2021 |
| CN | 114244933 A | 3/2022 |
| WO | 2021007978 A1 | 1/2021 |
| WO | 2021016752 A1 | 2/2021 |
| WO | 2021082554 A1 | 5/2021 |
| WO | 2021227692 A1 | 11/2021 |

* cited by examiner

ELECTRONIC DEVICE

CROSS-REFERENCE TO RELATED APPLICATIONS

This application is a Bypass Continuation application of International Patent Application No. PCT/CN2022/142588, filed Dec. 28, 2022, and claims priority to Chinese Patent Application No. 202111643463.6, filed Dec. 29, 2021, the disclosures of which are hereby incorporated by reference in their entireties.

BACKGROUND OF THE INVENTION

Field of the Invention

This application pertains to the field of communications technologies, and particularly relates to an electronic device.

Description of Related Art

With development of communications technologies, a size of a display screen of an electronic device is increasingly large. A relatively large display screen can not only improve the aesthetics of the electronic device, but also bring better visual impact to a user, thereby improving use experience of the electronic device.

However, as the size of the display screen increases, an overall size of the electronic device becomes larger accordingly, which is not convenient for the user to carry with. In order to solve this problem, folding screen electronic devices emerge in the market currently. The display screen of such electronic device is a flexible display screen, so a display zone size can be changed by folding and unfolding the electronic device. In this way, not only a relatively large display zone can be obtained, but also the size can be reduced by folding the electronic device, making the electronic device easy for the user to carry with.

SUMMARY OF THE INVENTION

The embodiments of this application provide an electronic device including a first device body, a second device body, a rotating mechanism, and a flexible display screen, where the flexible display screen includes a first display screen, a second display screen, and a third display screen;

the first device body is rotatably connected to the second device body via the rotating mechanism;

the first display screen is connected to the second display screen via the third display screen;

the first device body is connected to the first display screen, and the second device body is connected to the second display screen;

the rotating mechanism includes a shaft, a transmission apparatus, and a top rod, where the shaft is connected to the top rod via the transmission apparatus, and at least one of the first device body or the second device body is connected to the top rod; and the first device body and the second device body are able to rotate relative to each other so that the electronic device switches between a folded state and an unfolded state; where in a case that the electronic device is switching from the folded state to the unfolded state, the shaft is configured to drive, via the transmission apparatus, the top rod to move away from the shaft; and in a case that the electronic device is switching from the unfolded state to the folded state, the shaft is configured to drive, via the transmission apparatus, the top rod to approach the shaft.

DESCRIPTION OF REFERENCE SIGNS

110: first device body; 120: second device body; 101: guiding portion; 102: second slide groove;
210: first shaft; 220: second shaft;
300: rotating mechanism; 310: transmission apparatus; 311: gear; 311a: main body portion; 311b: connection portion; 311c: connecting post; 312: connecting rod; 313: rack; 314: lead screw; 315: slider; 316: transmission; 317: triangular plate; 320: first top rod; 330: second top rod; 340: support plate; 341: first gear portion; 342: second gear portion; 343: first limiting surface; 344: second limiting surface; 345: first mounting portion; 346: second mounting portion; 350: shaft bracket; 351: arc-shaped support surface; 360: connecting shaft; 370: bearing; 380: screw; 301: top rod;
400: flexible display screen; 410: first display screen; 420: second display screen; and 430: third display screen.

DESCRIPTION OF THE INVENTION

The following clearly describes the technical solutions in embodiments of this application with reference to the accompanying drawings in the embodiments of this application. Apparently, the described embodiments are only some rather than all of the embodiments of this application. All other embodiments obtained by persons of ordinary skill in the art based on the embodiments of this application shall fall within the protection scope of this application.

The terms "first", "second", and the like in this specification and claims of this application are used to distinguish between similar objects rather than to describe a specific order or sequence. It should be understood that the terms used in this way are interchangeable in appropriate circumstances so that the embodiments of this application can be implemented in other orders than the order illustrated or described herein. In addition, "and/or" in the specification and claims represents at least one of connected objects, and the character "/" generally indicates that the associated objects have an "or" relationship.

Usually, due to a bending radius of the electronic device, in a process of folding or unfolding the electronic device, the flexible display screen is prone to delamination due to excessive squeezing or fracture due to excessive pulling. Therefore, the flexible display screen of such electronic device has a short service life.

With reference to the accompanying drawings, the following describes in detail the electronic device provided in embodiments of this application through embodiments and application scenarios thereof.

Figure 1:
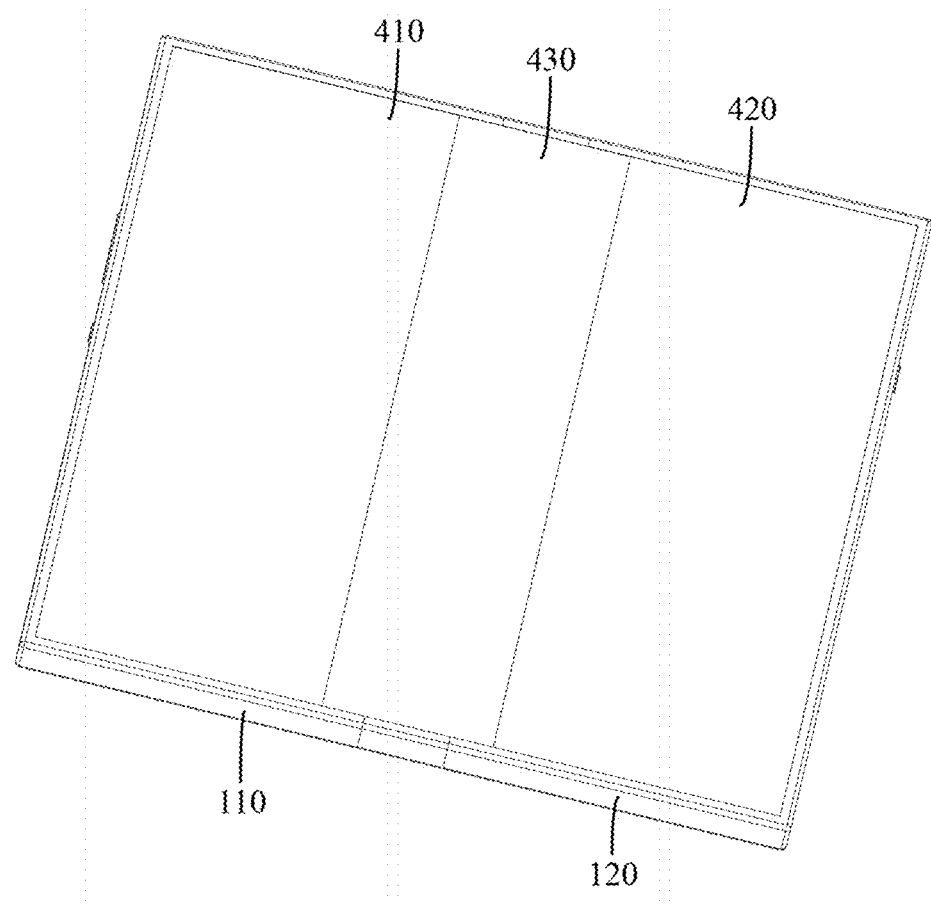
FIG. 1 is a schematic diagram of a structure of an electronic device in an unfolded state disclosed in an embodiment of this application.
Figure 2:
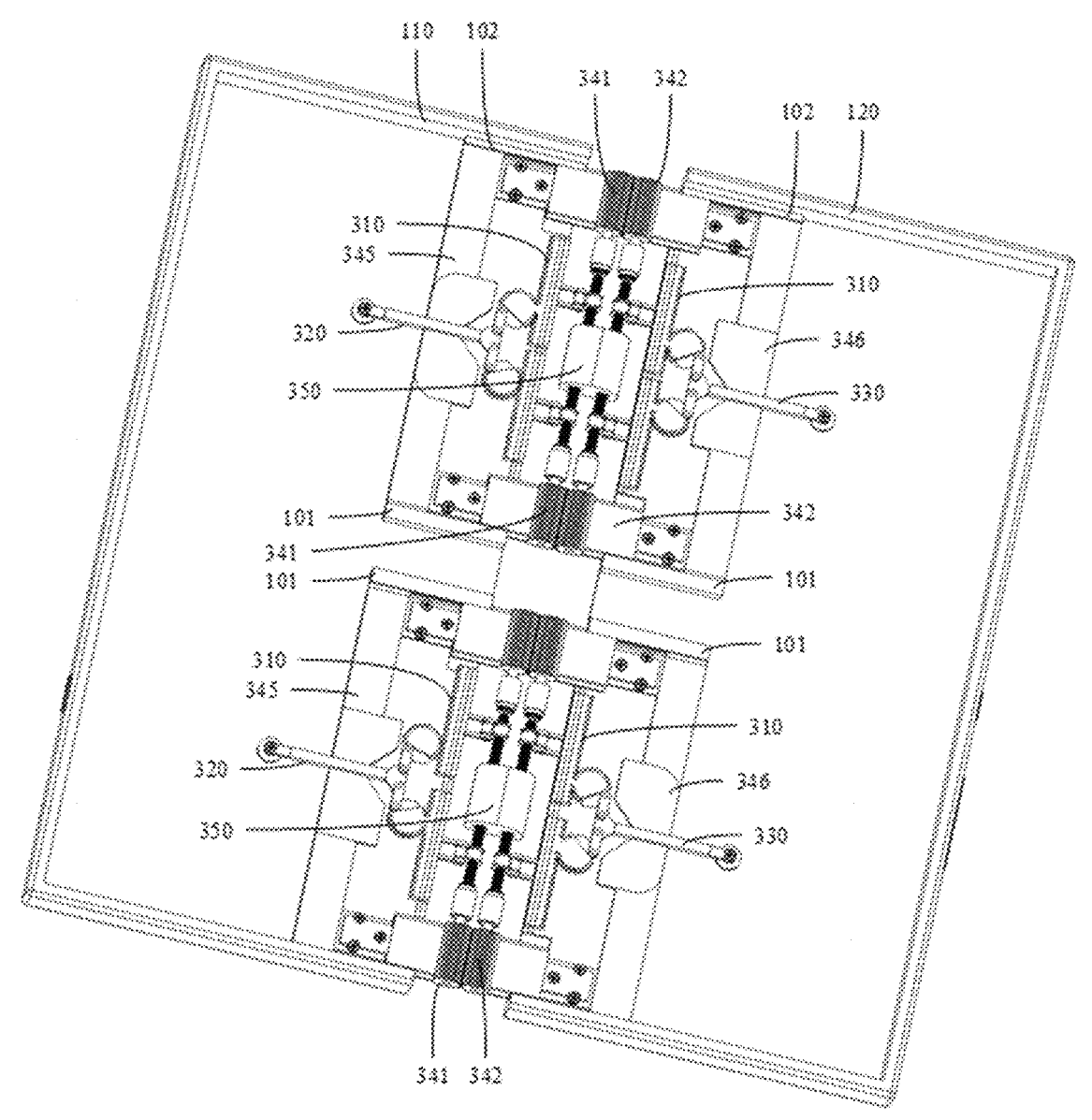
FIG. 2 is a schematic diagram of a partial structure of an electronic device in an unfolded state disclosed in an embodiment of this application.
Figure 3:
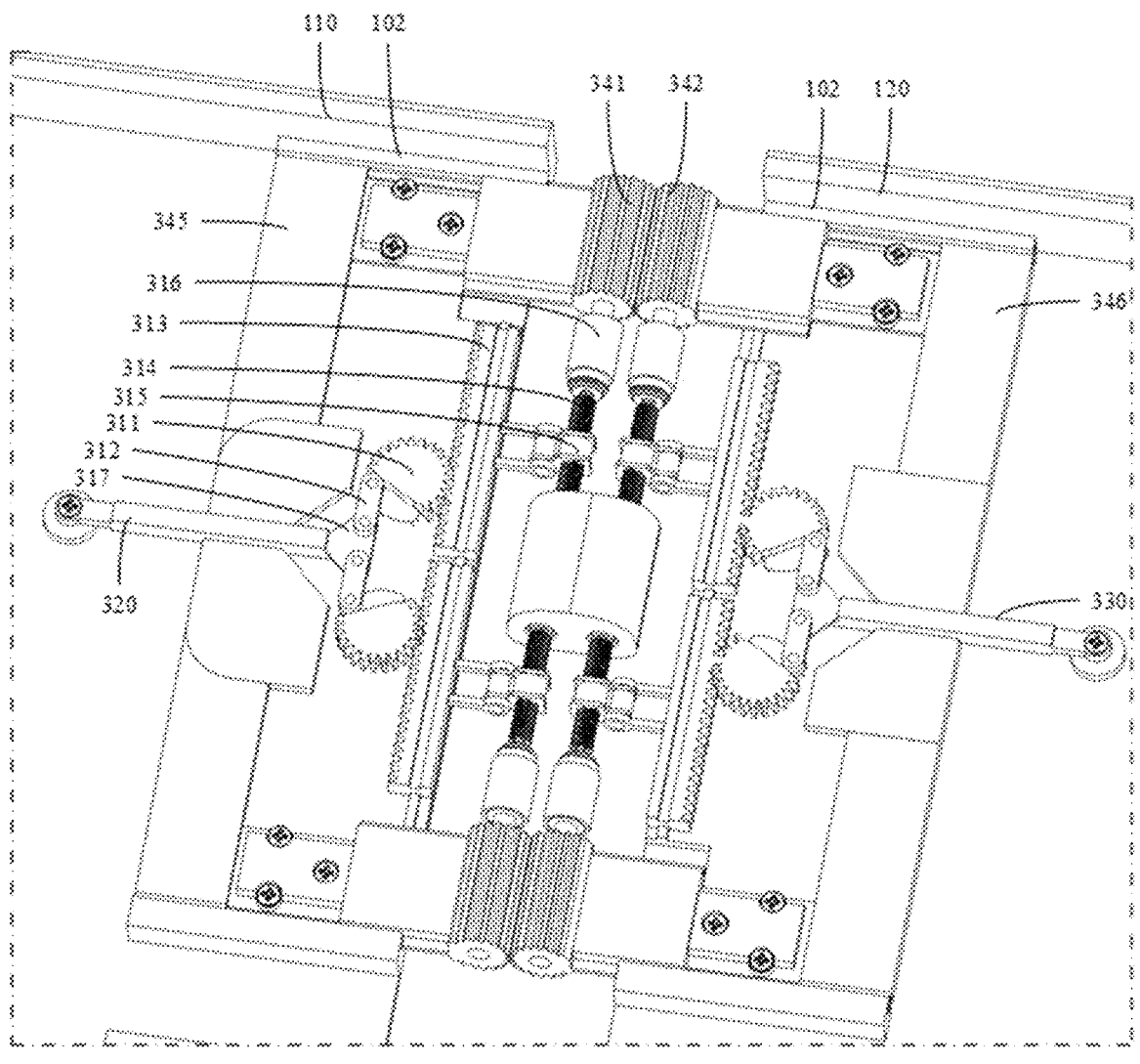
FIG. 3 is a locally enlarged schematic diagram of a partial structure of an electronic device in an unfolded state disclosed in an embodiment of this application.
Figure 4:
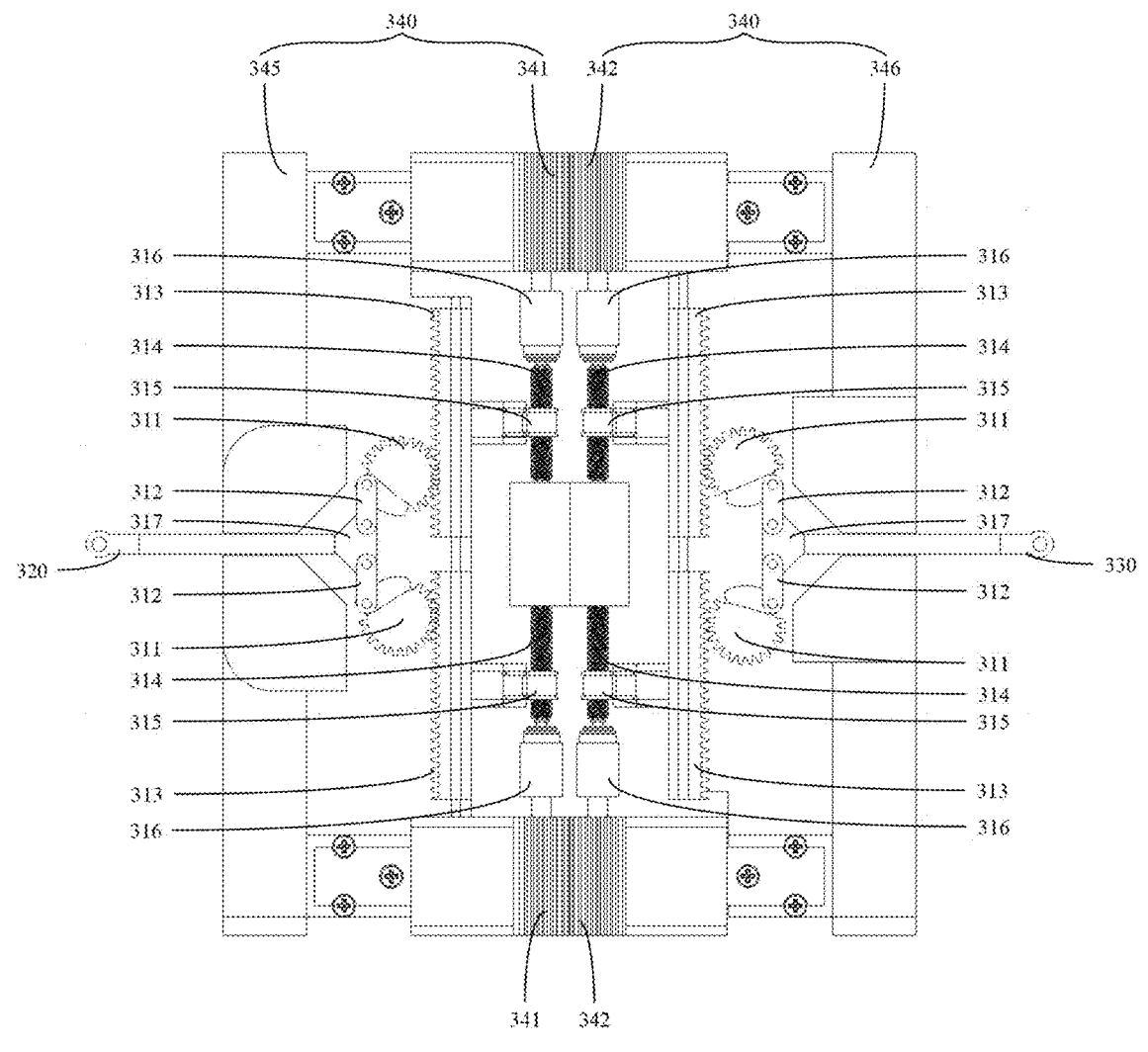
FIG. 4 is a schematic diagram of a structure of a shaft and a rotating mechanism of an electronic device in an unfolded state disclosed in an embodiment of this application.
Figure 5:
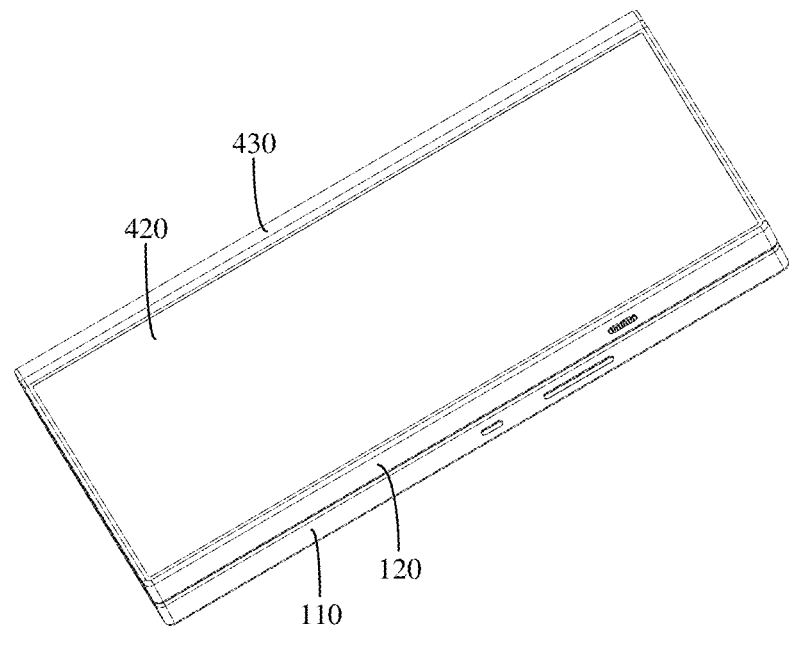
FIG. 5 is a schematic diagram of a structure of an electronic device in a folded state disclosed in an embodiment of this application.
Figure 6:
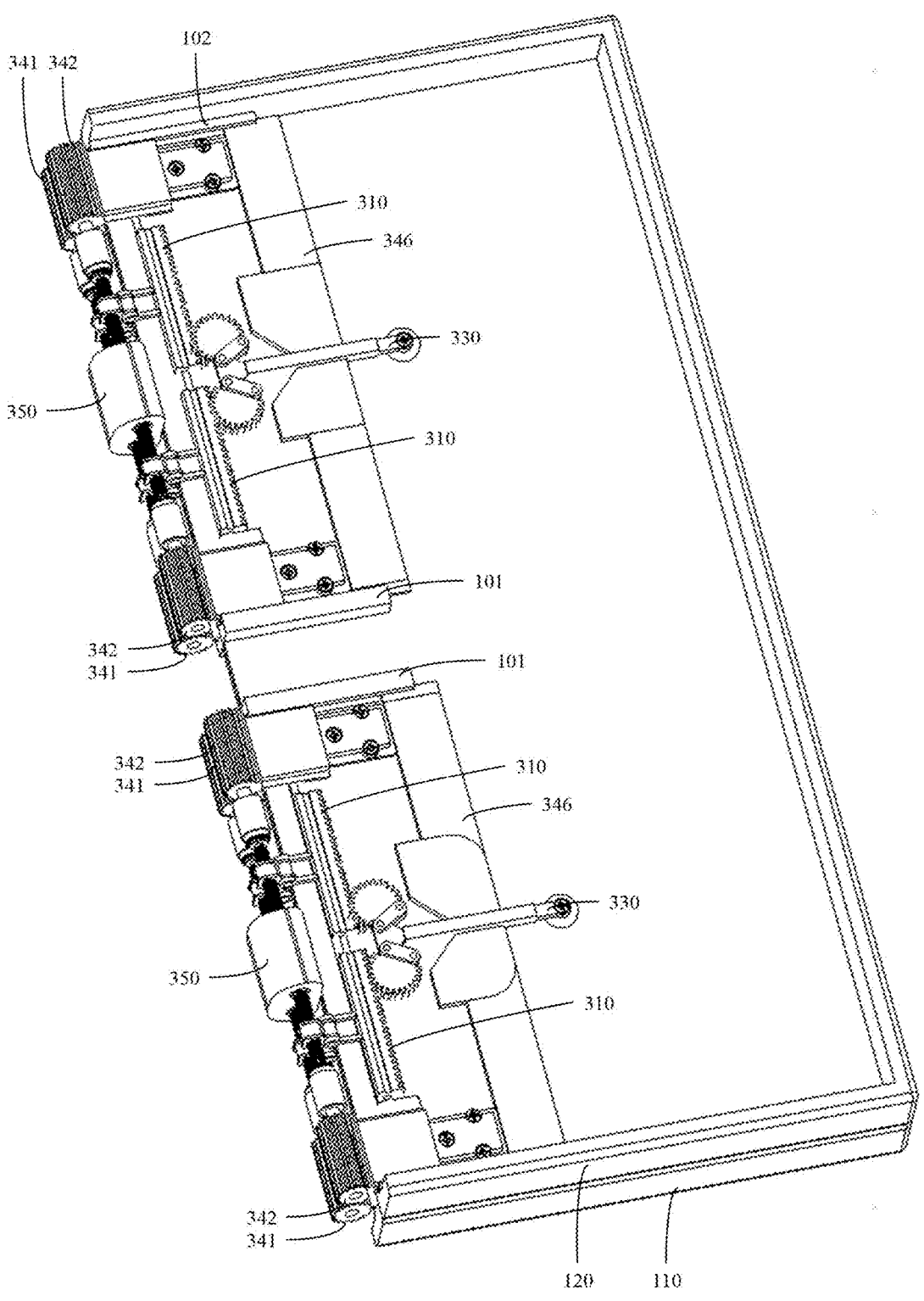
FIG. 6 is a schematic diagram of a partial structure of an electronic device in a folded state disclosed in an embodiment of this application.
Figure 7:
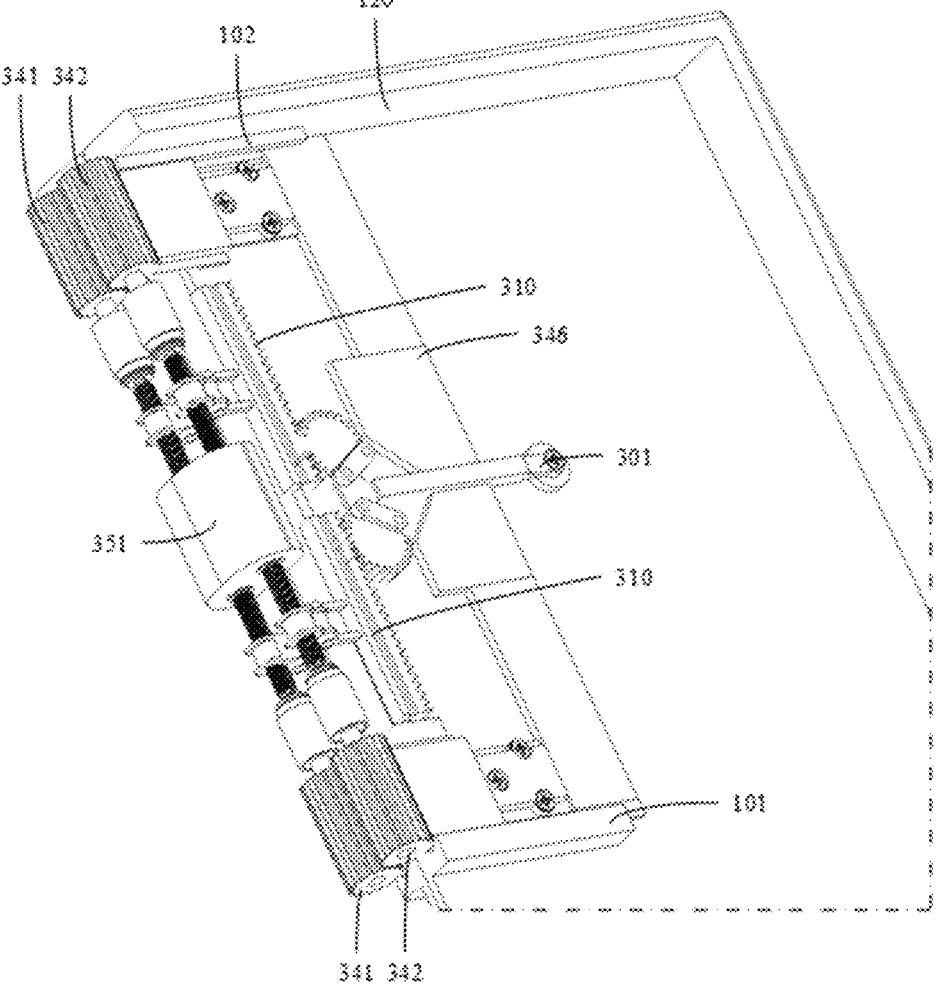
FIG. 7 is a locally enlarged schematic diagram of a partial structure of an electronic device in a folded state disclosed in an embodiment of this application.
Figure 8:
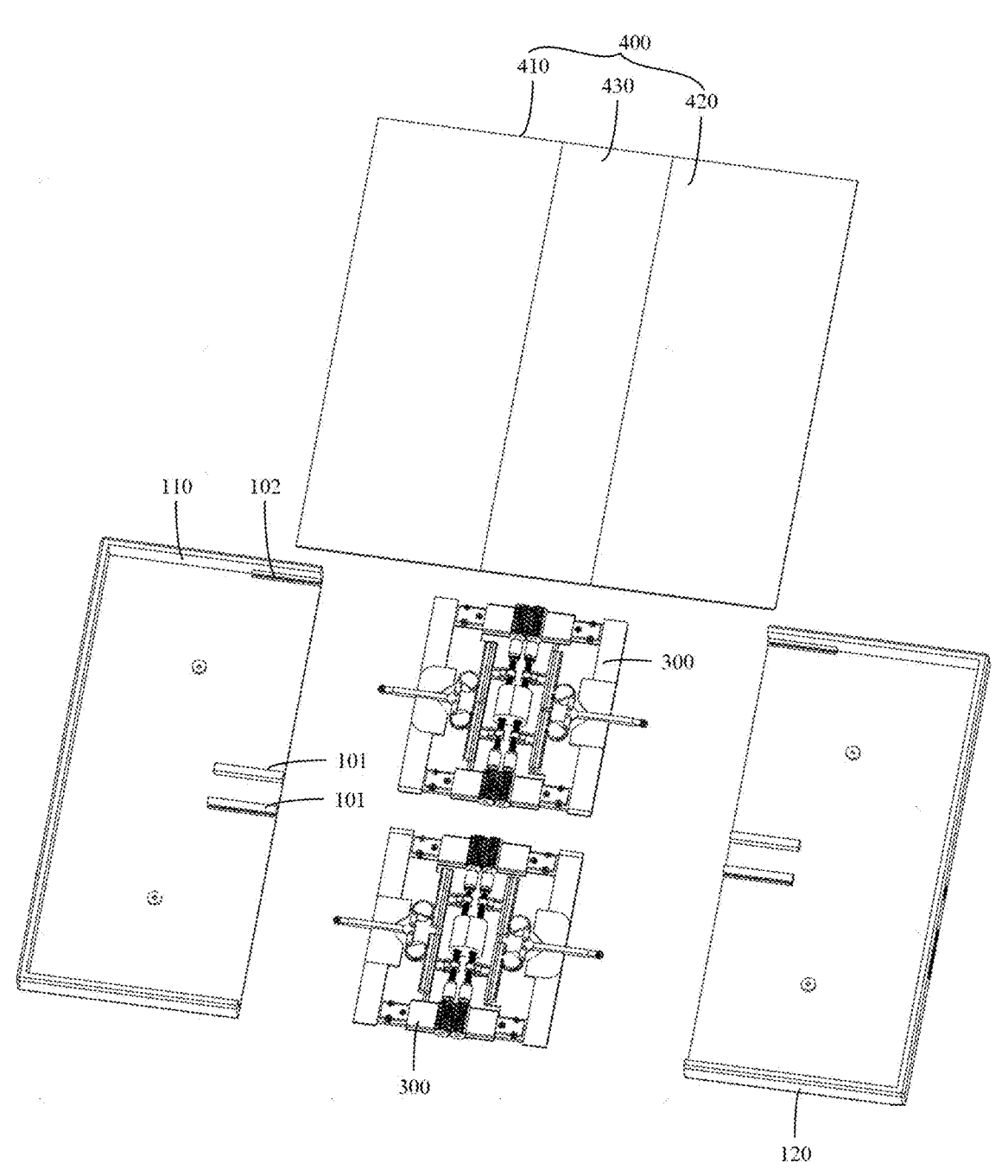
FIG. 8 is an exploded view of an electronic device disclosed in an embodiment of this application.
Figure 9:
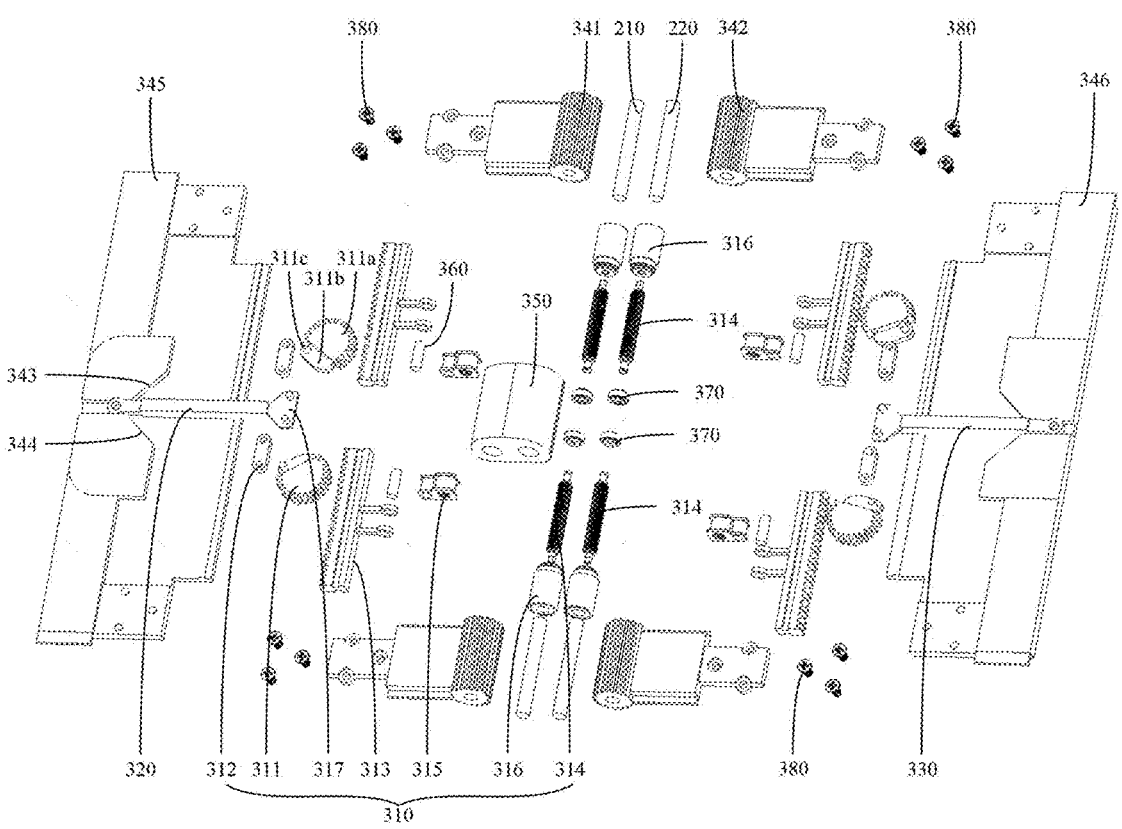
FIG. 9 is an exploded view of a shaft and a rotating mechanism disclosed in an embodiment of this application.
Figure 10:
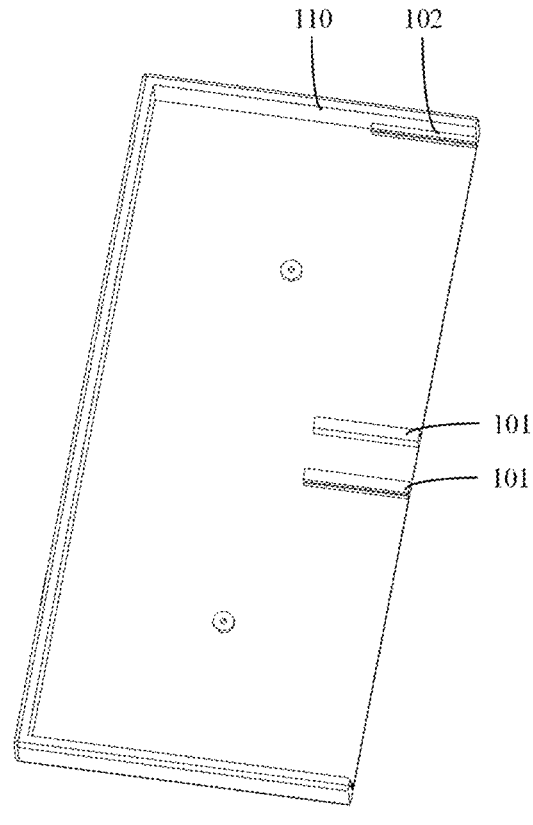
FIG. 10 is a schematic diagram of a structure of a first device body disclosed in an embodiment of this application.
Figure 11:
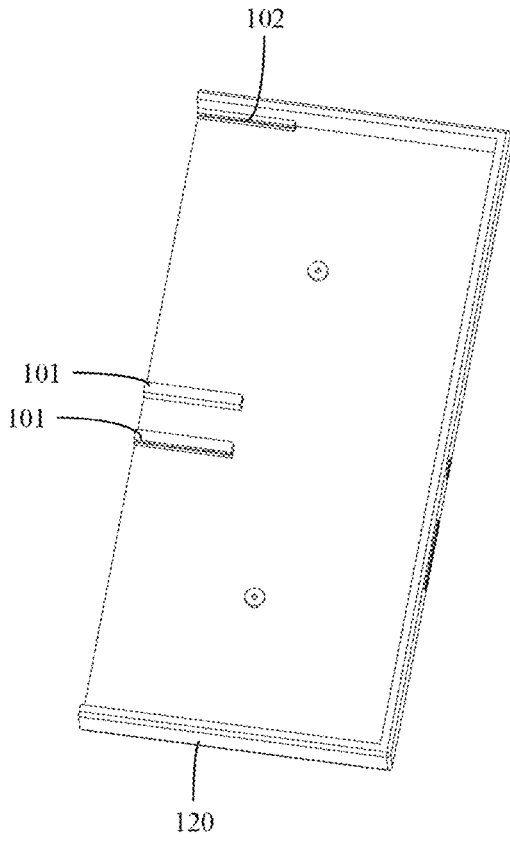
FIG. 11 is a schematic diagram of a structure of a second device body disclosed in an embodiment of this application.

Referring to FIG. 1 to FIG. 11, the embodiments of this application disclose an electronic device, including a first device body 110, a second device body 120, a rotating mechanism 300, and a flexible display screen 400.

The first device body 110 and the second device body 120 can be used as a basic portion of the electronic device to provide a mounting base for components such as the flexible display screen 400, a circuit board, and a battery. The first device body 110 and the second device body 120 each can include components such as a frame and a main board cover connected to the frame. The first device body 110 is rotatably connected to the second device body 120 via the rotating mechanism 300, and the first device body 110 and the second device body 120 can rotate relative to each other so that the electronic device switches between the folded state and the unfolded state. In other words, during folding or unfolding of the electronic device, the first device body 110 and the second device body 120 can rotate relative to each other. In a case that the electronic device is in the unfolded state, a display zone of the flexible display screen 400 is relatively large, which meets user requirements for a large display screen; and in a case that the electronic device is in the folded state, an overall size of the electronic device is relatively small, which is convenient for the user to carry with and hold the electronic device.

The flexible display screen 400 includes a first display screen 410, a second display screen 420, and a third display screen 430, where the first display screen 410 is connected to the second display screen 420 via the third display screen 430, so that the three can be fixed and spliced to form a complete display zone. Certainly, the first display screen 410, the second display screen 420, and the third display screen 430 can display separately. The first device body 110 can be connected to the first display screen 410 through adhering and the like, and the second device body 120 can be connected to the second display screen 420 through adhering and the like. Therefore, during folding or unfolding of the electronic device, driven by the first device body 110 and the second device body 120, the first display screen 410 and the second display screen 420 can rotate relative to each other, and the third display screen 430 can deform to adapt to an angle change between the first display screen 410 and the second display screen 420.

The flexible display screen 400 may be an outward-folding display screen. That is, in a case that the electronic device is in the folded state, the first device body 110 and the second device body 120 are both located between the first display screen 410 and the second display screen 420, and in this case, the first device body 110 and the second device body 120 are in a space enclosed by the flexible display screen 400. The flexible display screen 400 may alternatively be an inward-folding display screen. That is, in a case that the electronic device is in the folded state, the first display screen 410 and the second display screen 420 are both located between the first device body 110 and the second device body 120, and in this case, the first display screen 410 and the second display screen 420 are in a space between the first device body 110 and the second device body 120. Comparatively, if the flexible display screen 400 is an inward-folding display screen, in a case that the electronic device is in the folded state, the flexible display screen 400 is prone to crease due to squeezing of the first device body 110 and the second device body 120, and particles such as dust in an external environment easily enter the electronic device or the flexible display screen 400 because the flexible display screen 400 cannot fully fit; and if the flexible display screen 400 is an outward-folding display screen, the first device body 110 and the second device body 120 basically do not squeeze the flexible display screen 400, so that the flexible display screen 400 is not prone to crease, and the particles such as dust in the external environment do not easily enter the electronic device or the flexible display screen 400 because the flexible display screen 400 cannot fully fit. In addition, the outward-folding screen is always exposed, the electronic device can display through the flexible display screen 400 regardless of whether the electronic device is in the folded state or in the unfolded state, thereby meeting display demand of the user.

The rotating mechanism 300 includes a shaft, a transmission apparatus 310, and a top rod 301. The shaft is connected to the top rod 301 via the transmission apparatus 310, and at least one of the first device body 110 or the second device body 120 is connected to the top rod 301, that is, the transmission apparatus 310 can be connected to first device body 110 via the top rod 301. Alternatively, the transmission apparatus 310 is connected to the second device body 120 via the top rod 301. Alternatively, at least one transmission apparatus 310 is connected to the first device body 110 via at least one top rod 301, and another at least one transmission apparatus 310 is connected to the first device body 110 via another at least one top rod 301. Optionally, a segment of the top rod 301 can be fixedly connected to the first device body 110 or the second device body 120 via a connecting structure such as a screw. The top rod 301 can extend along a direction perpendicular to the shaft, so that a force applied by the top rod 301 to the first device body 110 or the second device body 120 has no components, thereby more effectively driving the first device body 110 or the second device body 120 to move.

During folding or unfolding of the electronic device, the first device body 110 and the second device body 120 can rotate with respect to the shaft, and the transmission apparatus 310 can transfer the force from the shaft to at least one of the first device body 110 or the second device body 120 through the top rod 301, so that the at least one of the first device body 110 or the second device body 120 can be triggered to move by the folding or unfolding operation. At least one of the first device body 110 or the second device body 120 can be defined as a target device body. During the folding or unfolding of the electronic device, a distance between the target device body and the shaft can change dynamically, and the distance between the target device body and the shaft can be defined as a first distance. The first distance changes with an angle between the first device body 110 and the second device body 120, where the angle change herein causes a change of a bending angle of the flexible display screen 400. Therefore, a correspondence exists between the first distance and the bending angle of the flexible display screen 400.

The transmission apparatus 310 and the top rod 301 each may be provided in only one. In this case, the shaft is in transmission connection with only the first device body 110 or the second device body 120 via the transmission apparatus 310 and the top rod 301. Alternatively, the transmission apparatus 310 and the top rod 301 are each provided in at least two, the shaft is in transmission connection with the first device body 110 via at least one transmission apparatus 310 and at least one top rod 301, and the shaft is in transmission connection with the second device body 120 via another at least one transmission apparatus 310 and another at least one top rod 301.

Optionally, the top rod 301 is provided in at least two, including a first top rod 320 and a second top rod 330. The shaft is connected to the first top rod 320 via at least one transmission apparatus 310, the shaft is connected to the second top rod 330 via another at least one transmission apparatus 310, the first top rod 320 is connected to the first device body 110, and the second top rod 330 is connected to the second device body 120. The first top rod 320 can be fixedly connected to the first device body 110 via a connecting structure such as a screw, and the second top rod 330 can also be fixedly connected to the second device body 120 via a connecting structure such as a screw. The first top rod 320 and the second top rod 330 both can be made in a stripe-shaped structure and can be parallel with the shaft, thereby facilitating layout design of the electronic device. In a case that the electronic device is switching from the folded state to the unfolded state, the shaft is configured to drive, via the transmission apparatus 310, the first top rod 320 and the second top rod 330 to move away from the shaft; and in a case that the electronic device is switching from the unfolded state to the folded state, the shaft is configured to drive, via the transmission apparatus 310, the first top rod 320 and the second top rod 330 to approach the shaft.

In addition, the shaft can be in transmission connection with the first device body 110 via at least two transmission apparatuses 310 and at least two first top rods 320 simultaneously, and the shaft can further be in transmission connection with the second device body 120 via at least two transmission apparatuses 310 and at least two second top rods 330 simultaneously, thereby improving connection reliability. In a case that the transmission apparatus 310, the first top rod 320, and the second top rod 330 are each provided in at least two, and structures of the transmission apparatuses 310, structures of the first top rods 320, and structures of the second top rods 330 may be the same or different, which is not limited in the embodiments of this application.

In the embodiments of this application, in a case that the electronic device is switching from the folded state to the unfolded state, the shaft is configured to drive, via the transmission apparatus 310, the top rod 301 to move away from the shaft. In this case, at least one of the first device body 110 or the second device body 120 moves away from the shaft, so that a support length of the first device body 110 and the second device body 120 to the flexible display screen 400 is prolonged, preventing the third display screen 430 of the flexible display screen 400 from delamination due to squeezing. In the case that the electronic device is switching from the unfolded state to the folded state, the shaft is configured to drive, via the transmission apparatus 310, the top rod 301 to approach the shaft. In this case, at least one of the first device body 110 or the second device body 120 approaches the shaft, so that a support length of the first device body 110 and the second device body 120 to the flexible display screen 400 is shortened, preventing the third display screen 430 of the flexible display screen 400 from fracture due to excessive pulling. It can be seen that the first device body 110 and the second device body 120 can move with respect to the shaft with the folding or unfolding of the electronic device, so that the flexible display screen 400 is not damaged due to folding or unfolding of the electronic device, providing a longer service life of the flexible display screen 400.

Optionally, the shaft can be provided in only one, where the shaft can be connected to the first device body 110 or the second device body 120 via only the transmission apparatus 310. However, such arrangement results in a relatively long movement stroke of the first device body 110 or the second device body 120, and during the folding or unfolding of the electronic device, the entire electronic device is prone to unstable center of gravity. Therefore, in other embodiments, the shaft may be provided in at least two, including a first shaft 210 and a second shaft 220, where the first shaft 210 and the second shaft 220 may be parallel to each other. The first shaft 210 may be connected to the first top rod 320 via at least one transmission apparatus 310, so as to be connected to the first device body 110. The second shaft 220 may be connected to the second top rod 330 via at least one transmission apparatus 310, so as to be connected to the second device body 120. In the case that the electronic device is switching from the folded state to the unfolded state, the first shaft 210 is configured to drive, via the transmission apparatus 310 and the first top rod 320, the first device body 110 to move away from the first shaft 210, and the second shaft 220 is configured to drive, via the transmission apparatus 310 and the second top rod 330, the second device body 120 to move away from the second shaft 220. In the case that the electronic device is switching from the unfolded state to the folded state, the first shaft 210 is configured to drive, via the transmission apparatus 310 and the first top rod 320, the first device body 110 to approach the first shaft 210, and the second shaft 220 is configured to drive, via the transmission apparatus 310 and the second top rod 330, the second device body 120 to approach the second shaft 220.

Optionally, the rotating mechanism 300 further includes a shaft bracket 350, where the shaft bracket 350 is provided with a first hole and a second hole. The first shaft 210 is connected to the first hole, and the second shaft 220 is connected to the second hole. In other words, the first shaft 210 can be connected to the second shaft 220 via the shaft bracket 350. Optionally, the shaft bracket 350 is provided with an arc-shaped support surface 351. In the case that the electronic device is in the folded state, the arc-shaped support surface 351 faces the third display screen 430. In the case that the electronic device is in the folded state, the arc-shaped support surface 351 can be in contact with the third display screen 430 to support the third display screen 430. Alternatively, a small gap may exist between the arc-shaped support surface 351 and the third display screen 430, and when the third display screen 430 is under pressure, the third display screen 430 becomes in contact with the arc-shaped support surface 351 to support the third display screen 430. In this case, the shaft bracket 350 can connect the first shaft 210 and the second shaft 220 and can also support the third display screen 430 in an appropriate case, so as to improve flatness of the third display screen 430, which facilitates the user to perform touch operations and protects the third display screen 430.

In the case that the flexible display screen 400 is an inward-folding display screen, the arc-shaped support surface 351 provided in the shaft bracket 350 may be an inner concave surface, where the inner concave surface is recessed in a direction away from the third display screen 430, increasing a support area of the arc-shaped support surface 351 to the third display screen 430. In the case that the flexible display screen 400 is an outward-folding display screen, the arc-shaped support surface 351 provided in the shaft bracket 350 may be an outer convex surface, where the outer convex surface protrudes in a direction close to the third display screen 430, increasing a support area of the arc-shaped support surface 351 to the third display screen 430.

During folding or unfolding of the electronic device, the first shaft 210 and the second shaft 220 rotate simultaneously. In order to improve rotation synchronism thereof, an elastic member made of a material such as rubber can be provided at end portions of the two shafts, and synchronized rotation of the first shaft 210 and the second shaft 220 can be implemented by using the friction between elastic members. However, because the elastic members are prone to slip therebetween, the synchronization of the rotation of the first shaft 210 and the second shaft 220 is poor. In order to solve this problem, in an optional embodiment, the rotating mechanism further includes a support plate 340. The support plate 340 is provided in at least two, at least one support plate 340 is connected to the first shaft 210, and another at least one support plate 340 is connected to the second shaft 220. The support plate 340 connected to the first shaft 210 includes a first gear portion 341, the support plate 340 connected to the second shaft 220 includes a second gear portion 342, the first gear portion 341 is sleeved on the first shaft 210, the second gear portion 342 is sleeved on the second shaft, and the first gear portion 341 meshes with the second gear portion 342. The support plate 340 connected to the first shaft 210 may further include a portion that is slidably connected to the first device body 110, and the support plate 340 connected to the second shaft 220 may further include a portion that is slidably connected to the second device body 120. During the folding or unfolding of the electronic device, the first gear portion 341 meshes with the second gear portion 342, so that the first device body 110 and the second device body 120 can rotate relative to each other, and the first gear portion 341 and the second gear portion 342 respectively drive the first shaft 210 and the second shaft 220 to rotate synchronously. Because the tooth meshing transmission manner is more reliable, this embodiment can improve synchronization when the first shaft 210 and the second shaft 220 rotate. In addition, the meshing between the first gear portion 341 and the second gear portion 342 may generate a damping sense to some extent during the folding or unfolding of the electronic device, so as to prevent a problem such as a collision caused by a too-fast speed of relative rotation between the first device body 110 and the second device body 120. A damping force between the first gear portion 341 and the second gear portion 342 can be optimized, so that the electronic device can be relatively easily folded or unfolded when the user exerts a force on the electronic device. In addition, when the user wants to keep the electronic device at any angle and removes the force, the first device body 110 and the second device body 120 can be kept in a target position.

When the rotating mechanism 300 further includes a support plate 340, the support plate 340 is connected to the shaft, and the support plate 340 can be used as a setting base of the transmission apparatus 310, thereby facilitating installation of the transmission apparatus 310, and further protecting the transmission apparatus 310. The top rod 301 can be slidably connected to the support plate 340. The transmission apparatus 310 includes a transmission assembly. The transmission assembly includes a gear 311 and a connecting rod 312. The gear 311 is connected to the shaft. One end of the connecting rod 312 is eccentrically hinged to the gear 311, that is, a connection between the connecting rod 312 and the gear 311 is located outside a rotation axis of the gear 311. The other end of the connecting rod 312 is hinged to the top rod 301. After the shaft drives the gear 311 to rotate, the gear 311 drives the connecting rod 312 to rotate, and the connecting rod 312 drives the top rod 301 to move, so that the top rod 301 approaches or moves away from the shaft. Optionally, the gear 311 is rotatably mounted on the support plate 340. In this embodiment, rotation of the gear 311 may be converted into movement of the top rod 301 through the connecting rod 312. Such transmission manner has characteristics of simple structure and reliable transmission. In addition, transmission is performed between the gear 311 and the shaft in a tooth meshing transmission manner. Such manner has characteristics of high transmission precision, long service life, and the like.

The transmission assembly may be provided in one or more. In a case that there are multiple transmission assemblies, at least two of the transmission assemblies are respectively located on two sides of the top rod 301. When the top rod 301 is driven by multiple transmission assemblies at the same time, a driving force applied on the top rod 301 is greater, and the driving force is more evenly distributed. Therefore, the structure can prevent an internal stress from being produced during the folding or unfolding of the electronic device, which helps the top rod 301 move more reliably and stably. Optionally, transmission assemblies connected to one top rod 301 may be symmetrically distributed, so that a direction of resultant force on the top rod 301 is a moving direction of the top rod 301, and the top rod 301 is prevented from being damaged due to an excessive internal stress.

When the rotating mechanism 300 further includes a shaft bracket 350, the shaft bracket 350 may use an integrated structure. In a case that the first device body 110 is connected to at least two top rods 301, or the second device body 120 is connected to at least two top rods 301, and there are at least two transmission assemblies connected to one top rod 301, a quantity of first gear portions 341 and a quantity of second gear portions 342 increase, and multiple groups of first gear portion 341 and second gear portion 342 are spaced apart. In this case, in order to increase a size of the shaft bracket 350 as much as possible to support the shaft and the third display screen 430, the shaft bracket 350 may be provided in plural, the shaft brackets 350 may be spaced apart along an axis direction of the shaft, and adjacent shaft brackets 350 are separated by the first gear portion 341 and the second gear portion 342.

Optionally, when the shaft includes a first shaft 210 and a second shaft 220, the first shaft 210 and the second shaft 220 each may be provided in at least two. The first shafts 210 are spaced apart along the axis direction of the first shaft 210 and are connected to the multiple first gear portions 341 in a one-to-one correspondence, and the second shafts 220 are spaced apart along the axis direction of the second shaft 220 and are connected to the multiple second gear portions 342 in a one-to-one correspondence.

Optionally, multiple transmission gears can be provided between the shaft and the gear 311, so as to transmit the driving force from the shaft to the gear 311. However, space occupied by the multiple transmission gears is relatively large. Therefore, the transmission assembly further includes a rack 313, where the rack 313 meshes with the gear 311, and the gear 311 is connected to the shaft via the rack 313. The shaft can drive the rack 313 to move, and the rack 313 further drives the gear 311 to rotate, so that the shaft drives the gear 311 to rotate. Optionally, the rack 313 may be parallel to the shaft, so that the rack 313 is closer to the shaft, and the electronic device has a more compact structure.

In order to implement the transmission connection between the shaft and the rack 313, the transmission assembly further includes a lead screw 314, where a threaded hole is provided on the rack 313, and the lead screw 314 can match the threaded hole through treaded transmission. In this embodiment, the rack 313 is directly connected to the lead screw 314. Once a problem such as slipping occurs in the threaded hole, the entire rack 313 needs to be replaced, resulting in excessive maintenance costs of the electronic device. In view of this, in another optional embodiment, the transmission assembly further includes a slider 315, a threaded hole is provided on the slider 315, the lead screw 314 matches the threaded hole through threaded transmission, and the slider 315 is connected to the rack 313. In this case, the lead screw 314 is in transmission connection with the rack 313 via the slider 315. In a case that a problem such as a slipping occurs in the threaded hole, only the slider 315 needs to be replaced. Therefore, maintenance costs of the electronic device are lower. In order to facilitate connection between the slider 315 and the rack 313, the transmission assembly further includes a connecting shaft 360, where the connecting shaft 360 may be parallel to the shaft, and the slider 315 is connected to the rack 313 via the connecting shaft 360.

When the rotating mechanism 300 further includes a shaft bracket 350, the shaft bracket 350 is provided with a first hole and a second hole, and one end of the lead screw 314 connected to the first shaft 210 can be installed in the first hole via a bearing 370, so that the first shaft 210 is connected to the first hole, and one end of the lead screw 314 connected to the second shaft 220 can be installed in the second hole via the bearing 370, so that the second shaft 220 is connected to the second hole.

The lead screw 314 and the shaft may be provided in parallel. The screw 314 and the shaft are connected via another transmission structure, or the lead screw 314 and the shaft are coaxially connected, that is, the shaft and the lead screw 314 may be fixed coaxially, and the shaft may directly drive the lead screw 314 to rotate. In the latter embodiment, the shaft and the lead screw 314 are arranged centrally, and basically have no spacing. In other words, the lead screw 314 may be disposed by using space in a position in which the shaft is located, and space occupied by both the rotating mechanism 300 and the shaft is smaller.

In an optional embodiment, the transmission assembly further includes a transmission 316, and the shaft is coaxially connected to the lead screw 314 via the transmission 316. The transmission 316 can change speed and torque, making it easier for the shaft to drive the first device body 110 and the second device body 120 to move. In addition, a transmission ratio of the transmission 316 can be adjusted so that a moving distance of the top rod 301 matches a bending angle of the flexible display screen 400, thereby more effectively preventing the flexible display screen 400 from being over-squeezed or over-pulled.

When the shaft includes a first shaft 210 and a second shaft 220, the lead screw 314 coaxially connected to the first shaft 210 has a first thread rotation direction, the lead screw 314 coaxially connected to the second shaft 220 has a second thread rotation direction, and the first thread rotation direction and the second thread rotation direction are opposite. Optionally, the thread rotation direction of the lead screw 314 coaxially connected to the first shaft 210 may be left-handed, and the thread rotation direction of the lead screw 314 coaxially connected to the second shaft 220 may be right-handed. When the first shaft 210 rotates counterclockwise and the second shaft 220 rotates clockwise, the first top rod 320 may approach the first shaft 210, and the second top rod 330 approaches the second shaft 220. Conversely, when the first shaft 210 rotates clockwise and the second shaft 220 rotates counterclockwise, the first top rod 320 moves away from the first shaft 210, and the second top rod 330 may move away from the second shaft 220. In this embodiment, only thread rotation directions of different lead screws 314 need to be set, so that relative movement between the first top rod 320 and the second top rod 330 can be implemented without a complex transmission structure for controlling a transmission direction. Therefore, in this embodiment, the structure of the electronic device can be simplified.

As mentioned above, the gear 311 may be connected to the top rod 301 via the connecting rod 312, the gear 311 has an end surface, and the connecting rod 312 may be directly connected to the end surface of the gear 311. The gear 311 and the connecting rod 312 connected in such manner jointly occupy a relatively large space because both have a specific thickness. Therefore, in order to reduce the space jointly occupied by the gear 311 and the connecting rod 312, in an optional embodiment, the gear 311 includes a body portion 311a and a connection portion 311b. The body portion 311a is provided with an outer peripheral surface and a first end surface, where the first end surface faces the flexible display screen 400. Transmission teeth are provided on a portion of the outer peripheral surface. The connection portion 311b is connected to another portion of the outer peripheral surface, the connection portion 311b is recessed with respect to the first end surface, the connection portion 311b is provided with a connecting post 311c, and the connecting post 311c and the first end surface are on a same side of the gear 311. In other words, the gear 311 includes portions of different thicknesses, where the body portion 311a of a relatively large thickness is used for providing transmission teeth, so as to ensure structural strength of the transmission teeth, the connection portion 311b of a relatively small thickness is used for connecting the connecting rod 312, and at least a portion of the connecting rod 312 may be recessed with respect to the first end surface of the gear 311. Therefore, the space occupied jointly by the gear 311 and the connecting rod 312 is smaller. Optionally, the connecting post 311c may be perpendicular to the first end surface, so as to implement connection between the connecting post 311c and the connecting rod 312.

The connecting rod 312 may be directly connected to one end of the top rod 301, but an end space of the top rod 301 is limited, making it inconvenient to directly connect the connecting rod 312. Therefore, in other embodiments, the transmission assembly further includes a triangular plate 317, and the connecting rod 312 may be connected to the top rod 301 via the triangular plate 317. The triangular plate 317 herein can provide a larger surface space, so that the triangular plate 317 can be more conveniently connected to the top rod 301 and the connecting rod 312, separately. Optional, there may be two transmission assemblies. The connecting rods 312 and the top rod 301 of the two transmission assemblies are respectively connected to three top corner portions of the triangular plate 317, so as to form a more stable transmission structure.

In order to assist in limiting the position of the top rod 301, the triangular plate 317 may abut against the support plate 340 during movement of the top rod 301, thereby implementing a limiting fit between the triangular plate 317 and the support plate 340. Optionally, the triangular plate 317 is provided with opposite first side surface and second side surface, and the support plate 340 is provided with a guiding groove, a first limiting surface 343, and a second limiting surface 344, where the top rod 301 is in sliding fit with the guiding groove, the first limiting surface 343 and the second limiting surface 344 are respectively connected to the two side walls of the guiding groove, the first side surface is opposite the first limiting surface 343, the first side surface may abut against the first limiting surface 343, the second side surface is opposite the second limiting surface 344, and the second side surface may abut against the second limiting surface 344. When the first side surface abuts against the first limiting surface 343, the triangular plate 317 stops moving, and then the top rod 301 stops moving, thereby achieving a limiting purpose. Similarly, when the second side surface abuts against the second limiting surface 344, the triangular plate 317 stops moving, and then the top rod 301 stops moving, thereby achieving a limiting purpose.

Optionally, the first side surface, the second side surface, the first limiting surface 343, and the second limiting surface 344 may all be flat surfaces, thereby simplifying a structure of the support plate 340 and the triangular plate 317, and improving a limiting effect.

The support plate 340 may be an integrated structure. Because the support plate 340 includes the first gear portion 341 or the second gear portion 342, and also includes a portion used for being in sliding fit with the top rod 301, once a wear amount of the first gear portion 341 or the second gear portion 342 exceeds an acceptable range, the entire support plate 340 needs to be replaced, causing relatively high maintenance costs of the electronic device. Therefore, optionally, the support plate 340 connected to the first device body 110 may include the first gear portion 341 and a first mounting portion 345. The first mounting portion 345 is in sliding fit with the top rod 301. The first gear portion 341 and the first mounting portion 345 are disposed separately, and may be detachably connected via a structure such as the screw 380. In a case that the wear amount of the first gear portion 341 exceeds an acceptable range, only the first gear portion 341 needs to be replaced.

Similarly, the support plate 340 connected to the second device body 120 may include the second gear portion 342 and a second mounting portion 346. The second mounting portion 346 is slidably fitted and connected to the top rod 301. The second gear portion 342 and the second mounting portion 346 are disposed separately, and may be detachably connected via a structure such as the screw 380. In a case that the wear amount of the second gear portion 342 exceeds an acceptable range, only the second gear portion 342 needs to be replaced.

In a case that the rotating mechanism 300 further includes a support plate 340, the support plate 340 is connected to the shaft, the first device body 110 is provided with a guiding portion 101, where the guiding portion 101 is provided with a first slide groove, a side wall of the first device body 110 is provided with a second slide groove 102, and two sides of the support plate 340 are in sliding fit with the first slide groove and the second slide groove 102, respectively. The first slide groove and the second slide groove 102 can provide guidance for movement of the support plate 340, so that relative rotation between the first device body 110 and the second device body 120 is smoother, and a damping sense to some extent is produced during the folding or unfolding of the electronic device, so as to prevent a problem such as a collision caused by a too-high speed of relative rotation between the first device body 110 and the second device body 120. Optional, the first device body 110 can be provided with at least two guiding portions 101, and the guiding portions 101 are spaced apart to improve a guiding effect.

It should be noted that the foregoing describes a solution in which the first device body 110 is disposed with the guiding portion 101 and the second slide groove 102. In other embodiments, the guiding portion 101 may be provided on the second device body 120, and the second slide groove 102 may be provided on a side wall of the second device body 120, so as to provide guidance for movement of the support plate 340. Optional, the second device body 120 can be provided with at least two guiding portions 101, and the guiding portions 101 are spaced apart to improve a guiding effect.

Certainly, the first device body 110 and the second device body 120 each can be provided with the guiding portion 101 and the second slide groove 102.

The electronic device disclosed in the embodiments of this application may be a smartphone, a tablet computer, an electronic book reader, a wearable device (such as a smart watch), an electronic game machine, or the like. The embodiments of this application do not limit the specific type of the electronic device.

The foregoing describes the embodiments of this application with reference to the accompanying drawings. However, this application is not limited to the foregoing implementations. These implementations are merely illustrative rather than restrictive. Inspired by this application, persons of ordinary skill in the art may develop many other forms without departing from the essence of this application and the protection scope of the claims, and all such forms shall fall within the protection scope of this application.

What is claimed is:

1. An electronic device, comprising a first device body, a second device body, a rotating mechanism, and a flexible display screen, wherein the flexible display screen comprises a first display screen, a second display screen, and a third display screen;

the first device body is rotatably connected to the second device body via the rotating mechanism;

the first display screen is connected to the second display screen via the third display screen;

the first device body is connected to the first display screen, and the second device body is connected to the second display screen;

the rotating mechanism comprises a shaft, a transmission apparatus, a top rod and a support plate, wherein the shaft is connected to the top rod via the transmission apparatus, and at least one of the first device body or the second device body is connected to the top rod;

wherein the support plate is connected to the shaft, and the top rod is slidably connected to the support plate;

and the transmission apparatus comprises a transmission assembly with a gear and a connecting rod, wherein the gear meshes with a rack which is driven by the shaft, one end of the connecting rod is eccentrically and rotatably hinged with the gear, and another end of the connecting rod is rotatably hinged with the top rod; and the first device body and the second device body are able to rotate relative to each other so that the electronic device switches between a folded state and an unfolded state; wherein in a case that the electronic device is switching from the folded state to the unfolded state, the shaft is configured to drive, via the rack, gear, and connecting rod, the top rod to move away from the shaft; and in a case that the electronic device is switching from the unfolded state to the folded state, the shaft is configured to drive, via the rack, gear, and connecting rod, the top rod to approach the shaft.

2. The electronic device according to claim 1, wherein the support plate is provided in at least two, and the shaft is provided in at least two, comprising a first shaft and a second shaft, wherein a support plate connected to the first shaft comprises a first gear portion, a support plate connected to the second shaft comprises a second gear portion, the first gear portion is sleeved on the first shaft, the second gear portion is sleeved on the second shaft, and the first gear portion meshes with the second gear portion.

3. The electronic device according to claim 2, wherein the rotating mechanism further comprises a shaft bracket, wherein the shaft bracket is provided with a first hole and a second hole, the first shaft being connected to the first hole and the second shaft being connected to the second hole, the shaft bracket is provided with an arc-shaped support surface, and in a case that the electronic device is in the folded state, the arc-shaped support surface faces the third display screen.

4. The electronic device according to claim 1, wherein the gear is connected to the shaft via the rack.

5. The electronic device according to claim 4, wherein the transmission assembly further comprises a lead screw and a slider, wherein the lead screw is coaxially connected to the shaft, a threaded hole is provided on the slider, the lead screw matches the threaded hole through threaded transmission, and the slider is connected to the rack.

6. The electronic device according to claim 5, wherein the transmission assembly further comprises a transmission, and the shaft is coaxially connected to the lead screw via the transmission.

7. The electronic device according to claim 5, wherein the shaft is provided in at least two, comprising a first shaft and a second shaft, wherein the lead screw coaxially connected to the first shaft has a first thread rotation direction, the lead screw coaxially connected to the second shaft has a second thread rotation direction, and the first thread rotation direction and the second thread rotation direction are opposite.

8. The electronic device according to claim 1, wherein the gear comprises a body portion and a connection portion, the body portion being provided with an outer peripheral surface and a first end surface, wherein the first end surface faces the flexible display screen, transmission teeth are provided on a portion of the outer peripheral surface, the connection portion is connected to another portion of the outer peripheral surface, the connection portion is recessed with respect to the first end surface, the connection portion is provided with a connecting post, and the connecting post and the first end surface are on a same side of the gear.

9. The electronic device according to claim 1, wherein the transmission assembly further comprises a triangular plate, wherein the triangular plate is provided with opposite first side surface and second side surface; and the support plate is provided with a guiding groove, a first limiting surface, and a second limiting surface, wherein the top rod is in sliding fit with the guiding groove; the first limiting surface and the second limiting surface are respectively connected to two opposite side walls of the guiding groove; the first side surface is opposite the first limiting surface, and the first side surface is able to abut against the first limiting surface; and the second side surface is opposite the second limiting surface, and the second side surface is able to abut against the second limiting surface.

10. The electronic device according to claim 1, wherein the transmission assembly is provided in plural, wherein at least two of transmission assemblies are respectively located on two sides of the top rod.

11. The electronic device according to claim 1, wherein the first device body is provided with a guiding portion, wherein the guiding portion is provided with a first slide groove, a second slide groove is provided on a side wall of the first device body, and two sides of the support plate are in sliding fit with the first slide groove and the second slide groove, respectively.

12. The electronic device according to claim 1, wherein in a case that the electronic device is in the folded state, the first device body and the second device body are both located between the first display screen and the second display screen.

* * * * *